United States Statutory Invention Registration [19]

[11] Reg. Number: H931

Feldman et al. [43] Published: Jun. 4, 1991

[54] METHOD FOR FORMING IMAGES AND LAMINATION OF SUCH IMAGES TO A NON-REACTIVE SUBSTRATE

[76] Inventors: Lyudmila Feldman; Marilyn K. Messer, both of The Mead Corporation, Mead World Headquarters, Courthourse Plz. NE., Dayton, Ohio 45463

[21] Appl. No.: 463,097

[22] Filed: Jan. 10, 1990

[51] Int. Cl.[5] ..... G03C 1/72

[52] U.S. Cl. ..... 430/138

[56] References Cited

U.S. PATENT DOCUMENTS 4,622,282 11/1986 Head et al. ..... 430/138
4,701,397 10/1987 Rourke et al. ..... 430/138
4,751,165 6/1988 Roarke et al. ..... 430/138

FOREIGN PATENT DOCUMENTS 2202641 9/1988 United Kingdom .

OTHER PUBLICATIONS

"One Step Lamination and Development of Receiver Sheet for Imaging Systems Employing Photohardenable Microcapsules", L. Feldman, *Research Disclosure*, Feb. 1989, 2 pp.

*Primary Examiner*—Linda J. Wallace

[57] ABSTRACT

A method for forming images on a non-reactive substrate such as paper or plastic film is disclosed, comprising the steps of: image-wise exposing an imaging sheet, said imaging sheet comprising a support having a layer of photosensitive microcapsules on the surface thereof, said microcapsules containing a photohardenable or photosoftenable composition including a photoinitiator, and a color precursor; assembling said image-wise exposed imaging sheet with a developer sheet; subjecting said assembly to a uniform rupturing force to cause said photosensitive microcapsules to rupture and transfer an image-wise pattern of said color precursor to said developer sheet thereby forming an image thereon; separating said imaging sheet from said developer sheet; assembling said image-bearing developer sheet with a non-reactive substrate to form a second assembly; and subjecting said second assembly to heat and a uniform force to laminate said image bearing developer sheet to said non-reactive substrate.

34 Claims, 2 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

METHOD FOR FORMING IMAGES AND LAMINATION OF SUCH IMAGES TO A NON-REACTIVE SUBSTRATE

BACKGROUND OF THE INVENTION

1. Field of the Invention

The present invention relates to an imaging system. More particularly, the present invention relates to a method for developing a full color image on a non-reactive substrate such as paper or plastic film wherein a developer sheet comprising a layer of developer material on the surface thereof is laminated to the surface of the non-reactive substrate via the heat activated adhesive properties of the developer layer.

2. Description of the Prior Art

Photosensitive imaging systems employing microencapsulated radiation-sensitive compositions (also known as cylithographic imaging systems) are the subject of commonly assigned U.S. Pat. Nos. 4,399,209, 4,772,541 and 4,842,976 to The Mead Corporation. These imaging systems are characterized in that an imaging sheet containing a layer of photosensitive microcapsules is image-wise exposed to actinic radiation. In the most typical embodiments, the photosensitive microcapsules contain, as an internal phase, a photopolymerizable composition including a polyethylenically unsaturated compound, a photoinitiator and a color precursor. Image-wise exposure of the imaging sheet hardens the internal phase of the microcapsules. Following exposure, the imaging sheet is subjected to a uniform rupturing force by passing the imaging sheet in contact with a developer sheet through the nip between a pair of pressure rollers whereupon the color precursor is transferred to the developer sheet where it reacts to form an image.

Techniques have been disclosed for forming images on plain paper. In U.S. Pat. No. 4,622,282 issued Nov. 11, 1986 a process is disclosed which comprises image-wise exposing an imaging sheet to actinic radiation. The imaging sheet includes a support having a layer of microcapsules on the surface thereof containing a photosensitive composition and a chromogenic material. The sheet is subjected to a uniform rupturing force in contact with a sheet of plain paper. The chromogenic material is image-wise transferred to the sheet of plain paper and the surface of the sheet of plain paper carrying the chromogenic material is then contacted with a developer material to form a visible image.

In accordance with one embodiment of the invention described in U.S. Pat. No. 4,622,282, the developer material is provided on the surface of the imaging sheet with the microcapsules containing the chromogenic material. The developer is provided in admixture with the microcapsules in a single layer on the surface of the imaging sheet, but embodiments are also possible in which the developer is provided in a separate layer underlying the layer of microcapsules. With the developer present on the surface of the imaging sheet, images are formed by simply image-wise exposing the sheet to actinic radiation, subjecting the sheet to a uniform rupturing force in contact with plain paper, and effecting transfer to the surface of the plain paper. The developer and the chromogenic material begin to react upon contact with each other as they are transferred to the surface of the plain paper.

As disclosed in U.S. Pat. No. 4,622,282, when the developer is not present on the imaging sheet, after transfer of the chromogenic material to the plain paper, the paper is contacted with a developer material and the image is developed through reaction of the chromogenic material and the developer. In one embodiment a paper is contacted with a rotating developer applicator brush. The brush applies a developer material onto the surface of paper where it reacts with the chromogenic material and produces the color image. However, brush application of the developer is disadvantageous as it is often accompanied by streaking, loss of resolution and cross-colorization due to brush contamination, wherein the brush carries precursor and/or developer across the surface of the paper to undesired areas.

U.S. Pat. No. 4,701,397 teaches another method for forming images on plain paper wherein a layer of microcapsules and developer is area-wise transferred to the surface of a plain sheet of paper to form an image. In this method, the microcapsules and developer are coated in a single layer or as separate layers on a thin polymeric film. The sheet is image-wise exposed to actinic radiation, assembled with a sheet of plain paper and subjected to pressure whereupon, in the image areas, the layer of developer is transferred (selectively adhered) to the paper and an image is formed.

U.K. Patent Application 2 202 641 discloses a method for copying on paper or cloth using the cylithographic system wherein a wax is incorporated in the developer layer. The method relies upon two transfer steps. In the first, the image-wise exposed imaging sheet is assembled with a sheet of the developer on the surface of a temporary support and pressure is applied as in U.S. Pat. No. 4,399,209 and an image is formed on the developer sheet. The developer sheet is juxtaposed a sheet of paper and pressure is applied whereupon the developer layer is transferred as a continuous film from the carrier sheet to the paper surface.

Research Disclosure No. 29863 published in February 1989 teaches a one-step method for lamination and development of the receiver sheet utilized in imaging systems employing photohardenable microcapsules. The latent image formed on the donor sheet is transferred to the receiver sheet. Thereafter the receiver sheet is brought in contact with a laminating material which has been coated on one surface thereof with a developer resin, thereby achieving both lamination and development in one step.

SUMMARY OF THE INVENTION

This invention relates to a process using cylithographic imaging systems for forming images on a nonreactive substrate such as paper or transparent plastic film. The image produced may be a single color or full color image.

Generically, the invention can be considered as involving two embodiments. In accordance with one embodiment of the present invention, the color precursor is initially released image-wise from the microcapsules upon rupture of the microcapsules forming a latent image on the imaging sheet. The latent image is then transferred to a non-reactive substrate and a developer sheet is laminated to the non-reactive substrate to develop the image. In this embodiment it is particularly preferred to use a high grade paper such as magazine stock or cast coated paper as the non-reactive substrate to ensure high image quality. In another embodiment the color precursor is transferred to the developer sheet where an image is formed and the image-bearing developer sheet is then laminated to the non-reactive substrate. Lamination of the developer sheet to the non-reactive sheet is possible because the developer has properties similar to a heat activated adhesive. When it is heated in contact with a non-reactive substrate such as paper or a plastic film, the developer becomes fixed to the non-reactive substrate to yield the laminate. In this latter embodiment, the grade of paper employed is not so critical as in the previous embodiment.

The process comprises image-wise exposing an imaging sheet including a support having a layer of photosensitive microcapsules on the surface thereof, said microcapsules containing a photohardenable or photosoftenable composition, a color precursor and a photoinitiator. The imaging sheet is assembled with a web carrying a layer of a developer (hereafter "developer sheet") or with a non-reactive sheet such as paper and the microcapsules are subjected to a uniform rupturing force whereby the color precursor is released image-wise from the microcapsules and transferred. When the transfer is to the developer sheet, the color precursor reacts to produce a colored image. The developer sheet carrying the developed image is subsequently assembled with a non-reactive substrate such as a sheet of paper or plastic film and subjected to heat and pressure whereupon the developer sheet having the image thereon is laminated as a film to the surface of the non-reactive substrate. Alternatively, when the transfer is to a non-reactive sheet, a latent image is formed. The non-reactive sheet having the latent image thereon is assembled with a developer sheet and laminated whereupon an image is formed.

These imaging methods are advantageous for several reasons. First of all, in this method, unreacted monomer released from the microcapsules is sandwiched and contained between the laminated non-reactive substrate (e.g., paper, plastic film etc.) and the developer sheet which prevents the unreacted monomer from coming into contact with the skin upon handling. This is believed to be advantageous because some unreacted monomers may be irritants. Secondly, because the imaged layer is laminated between two inert materials, the image is protected from atmospheric conditions and other elements which may cause deterioration of the image. Thirdly, the aesthetic appearance of the imaged sheet is significantly improved due to the high gloss and additional stiffness introduced by the transparent cover sheet. The greatest problem with creating photographic quality images on paper is related to the nonuniformity of the paper structure and surface. In the present method where the image is created on a thin, uniform film and then laminated to paper, this problem is eliminated. Images obtained by this technique do not possess the typical defect known in the industry as mottle. Finally, because the microcapsules and the developer can both be carried on thin plastic films, substantially less pressure is required to rupture the microcapsules and exude the color precursor. This simplifies the design of the copier or printer and more particularly it simplifies pressure roller design as uniform, lineal pressures are easier to establish when using thin, dimensionally stable films of uniform density and thickness.

DETAILED DESCRIPTION OF THE INVENTION

The present invention enables paper, plastic film and other non-reactive supports to be utilized with a cylithographic imaging system; i.e., a system utilizing photosensitive microcapsules. By "non-reactive substrate" is meant paper, film, board and the like which does not have a developer composition or a similar material associated with the substrate, however this definition is not meant to exclude substrates which are sized or otherwise surface treated to enhance transfer of the developer, limit feathering or penetration, enhance adhesion or affinity for the developer, etc. A particularly convenient paper support for use in this invention is xerographic bond paper.

In addition to paper, the method of the present invention is useful in forming images on other non-reactive substrates. This invention is particularly useful in forming images on transparent films such as polyethylene terephthalate (PET) and, more particularly, on xerographic transparent films. In addition, the invention may be used to form images on certain photographic base papers, e.g., papers carrying a layer of polyethylene on the surface on which the image is formed. If desired or necessary, these photographic base papers may be reversed and the image may be formed on the paper stock while the polyethylene may function to seal the back surface.

The method of this invention is also useful in forming images on non-conventional substrates such as glass, cardboard, container board, etc. One advantage to the ability to form images on container board is in preparing mock-up container designs. Images can also be formed on plastic substrates of the type used in credit cards.

For forming high quality images, so-called magazine stock and other coated papers may be used in the present invention. Bank check stock may also be used. For example, by use of this invention, it is possible to put the picture of the payor on the check to prevent fraud. This may also be helpful in preparing credit cards as previously noted.

Imaging systems utilizing photosensitive microcapsules are described in U.S. Pat. Nos. 4,399,209, 4,440,846, 4,772,530 and 4,772,541 and 4,842,976 (full color). To the extent necessary, the teachings of these patents with respect to the preparation of microcapsules, image-forming agents, developer materials, exposure techniques, microencapsulation techniques, color precursors, photosensitive compositions, initiator systems, etc., are hereby incorporated by reference.

Figure 1:
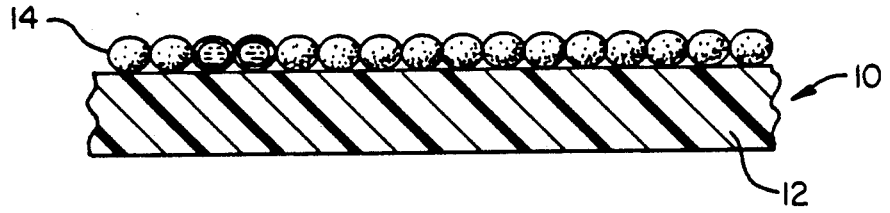
FIG. 1 is a schematic illustration in cross-section of an imaging sheet in accordance with the present invention.

FIG. 1 illustrates one example of an imaging sheet useful in the present invention. Therein an imaging sheet 10 is shown comprising a substrate 12 coated with a layer of microcapsules 14. Preferably the layer of microcapsules contains three sets of microcapsules sensitive to red, green and blue light respectively and containing cyan, magenta and yellow image-forming agents as described in U.S. Pat. Nos. 4,772,541 and 4,842,976. The substrate may be aluminized PET which is advantageous because light incident the microcapsule layer 14 passing through the layer is reflected back into the microcapsules making more efficient use of the incident light. In this way the film speed of the imaging sheet is improved. Other supports including paper and synthetic films such as PET are also useful.

In selecting a substrate for both the imaging sheet and the developer sheet it is desirable to use the thinnest and smoothest material which can be readily handled within the printer or copier as this reduces the amount of pressure required to rupture the microcapsules and cause the internal phase to exude and transfer to the developer layer. The thicker the substrate, the larger is the area of the pressure nip through which it passes and the greater is the pressure which must be applied to achieve a predetermined lineal pressure. Similarly, the more irregular the surface, the greater is the pressure required to achieve a desired uniform lineal pressure. The preferred substrate, balancing cost and effectiveness, is synthetic films ranging from about 3 to 12 microns and more preferably about 7 to 10 microns in thickness. Thinner films are more difficult to handle and thus less desirable although from the standpoint of simplifying pressure roller design they may be desirable.

The microcapsules are filled with an internal phase 16 comprising a photohardenable (the preferred embodiment) or photosoftenable composition including a photoinitiator, and a color precursor. The color precursor is typically a substantially colorless electron donating compound for which there are examples in the art. In the preferred embodiments of the invention the imaging sheets described in U.S. Pat. No. 4,772,541 are used.

Figure 2:
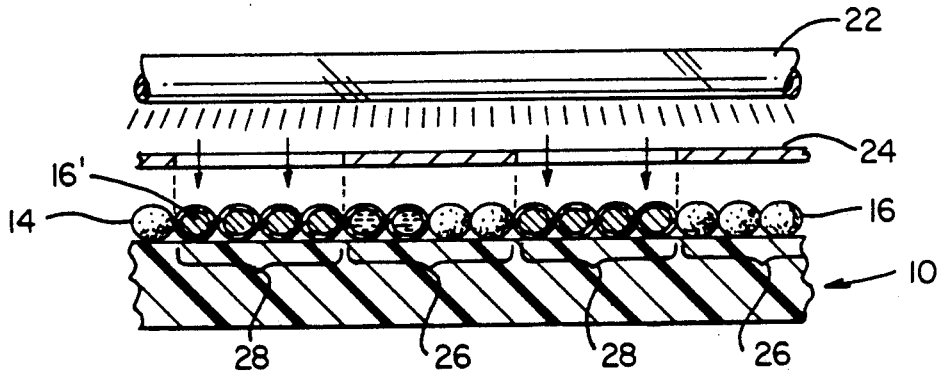
FIG. 2 is a schematic illustration of exposure of the imaging sheet.

Exposure of the imaging sheet 10 by transmission imaging is shown in FIG. 2 wherein a source of radiant energy 22 is positioned at a certain predetermined distance from the surface of the imaging sheet 10 with a Mask 24 therebetween. In this illustration the photosensitive material is a positive working radiation curable material. Irradiation of the exposed areas 28 causes the radiation curable material in the internal phase 16 to polymerize, thereby gelling, solidifying or otherwise immobilizing the color precursor. To simplify the illustration, internal phase 16' in the exposed areas 28 is shown as a solid whereas the internal phase 16 remains liquid in the unexposed areas 26. The internal phase 16' may in fact be a solid or semisolid or there may be degrees of solidification ranging from liquid to solid depending upon the amount of exposure any given microcapsule receives.

Figure 3:
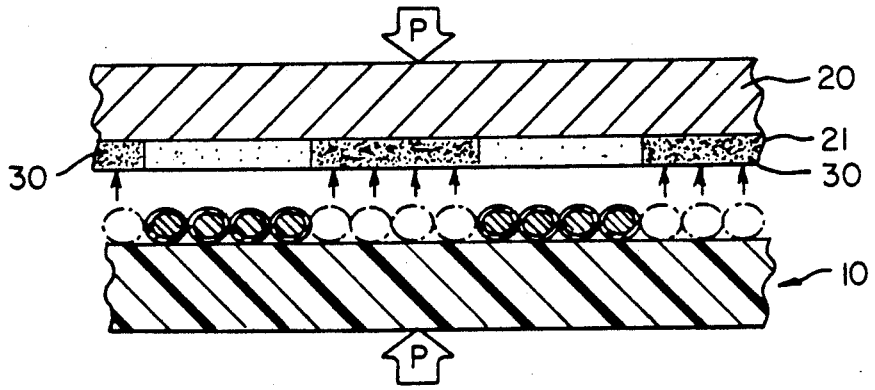
FIG. 3 is a schematic illustration of transfer of the color precursor to a developer sheet to form an image thereon.

Transfer of the color precursor to the developer sheet is shown in FIG. 3 wherein the now exposed imaging sheet 10 is placed with its exposed microcapsule layer 14 in face-to-face contact with developer layer 21 of developer donor sheet 20 and a pressure P is uniformly applied across the sheets. For simplification, the pressure is shown as rupturing the microcapsules in the unexposed areas 26 and not rupturing the microcapsules in the exposed areas 28. In actuality all the capsules may be ruptured, but the chromogenic material is immobilized as a result of the increased viscosity in the internal phase 16' in the exposed areas 28 upon exposure. Typically the capsules are ruptured by passing the imaging sheet 10 and the developer sheet 20 together through a nip between a pair or stack of pressure rollers. This causes the internal phase 16 from the unexposed areas 26 to transfer to the developer sheet 20 as is shown schematically by arrows in FIG. 3. Upon transfer of the internal phase 16 to the developer sheet 20, the chromogenic material forms a visible image 30 in the developer layer 21.

The visible image is usually the product of an acid-base reaction between the color precursor, which is usually an electron donor, and the developer which is usually an electron acceptor. Alternatively, coupling reactions analogous to those used in color photographic materials or redox reaction pairs may be used. Some of these alternative systems are described in U.S. Pat. No. 4,399,209.

Figure 4:
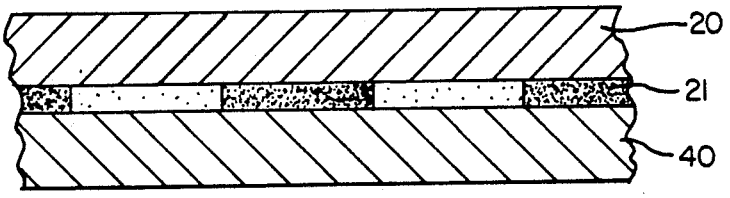
FIG. 4 is a schematic illustration of lamination of the developer sheet to a non-reactive substrate.

FIG. 4 illustrates lamination of the developer sheet 20 to the surface of a paper sheet 40. The developer sheet 20 is positioned with its developer layer 21 adjacent a sheet of paper 40. To effect lamination of the developer sheet to the paper sheet, the developer sheet is heated prior to or concurrently with its contacting the paper sheet and pressure is applied to the sheets. The degree of heating necessary to effect lamination of the developer sheet to the non-reactive substrate will depend on the heat activated adhesive properties of the developer resin and the degree of pressure applied. Typically, the developer sheet will be fed between pressure rollers which are heated from about 75° to 135° C.

Figure 5:
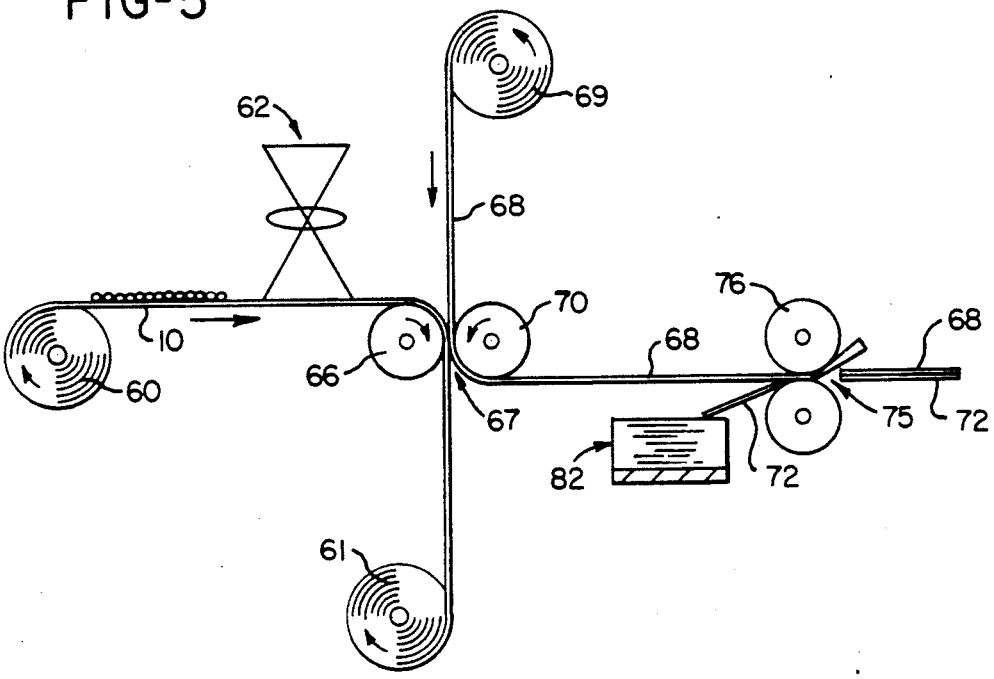
FIG. 5 is a schematic illustration of an apparatus useful in practicing the present invention.

FIG. 5 is a schematic drawing illustrating an apparatus for imaging using a non-reactive substrate as disclosed in the present invention. Roll 60 dispenses imaging sheet 10 in the direction shown by the arrow and roll 61 subsequently collects expended imaging sheet 10. As imaging sheet 10 passes under exposure station 62, it is exposed in an image-wise pattern causing the microcapsules present on the surface of imaging sheet 10 to photoharden or photosoften in an image-wise pattern depending on the nature of the photosensitive composition they contain. Imaging sheet 10 then passes through the nip 67 between rollers 66 and 70 where it is brought into contact with a developer web 68 which is fed from pay out roll 69. It is contemplated that the developer sheet may, if desired, be fed from a stack of individual sheets. Movement is in the direction shown by the arrow. When imaging sheet 10 is pressed through the nip between pressure rollers 70 and 66, the pressure exerted by the rollers causes certain microcapsules on the surface of imaging sheet 10 to rupture thereby transferring the color precursor to developer sheet 68 whereupon a visible image is formed. One of the advantages of this system is that the substrate for both the developer sheet and the image receiving sheet may be plastic film. This enables the use of much lower pressure in rollers 66 and 70. Thus, these rollers may take a form not previously possible due to the lower pressures which may be used.

The non-reactive sheet 72 next is fed from a stack 82 to the nip 75 between heated pressure rollers 76 and 78. If desired, the non-reactive substrate may be dispensed on a web from a continuous roll. Web 68 carrying the developer is passed between roller 76 and 78 and through the pressure nip 75. As the non-reactive substrate 72 passes through nip 75 between pressure rollers 76 and 78 in contact with developer sheet 68, the developer sheet 68 having the image on the surface thereof is laminated to non-reactive substrate 72 using the heat activated adhesive properties of the developer layer. Where the developer sheet and the non-reactive substrate are fed from payout rolls, means for cutting the sheets to size may be conveniently positioned either before or after the nip 75 between pressure rollers 76 and 78.

The internal phase of the microcapsules as described above can be encapsulated in any conventional manner. Oil soluble chromogenic materials have been encapsulated in hydrophilic wall-forming materials such as gelatin wall-forming materials (see U.S. Pat. Nos. 2,730,456 and 2,800,457 to Green et al) including gum arabic, polyvinyl alcohol, carboxymethylcellulose; resorcinol-formaldehyde wall-formers (see U.S. Pat. No. 3,755,190 to Hart et al), isocyanate wall-formers (see U.S. Pat. No. 3,914,511 to Vassiliades) isocyanate-polyol wall-formers (see U.S. Pat. No. 3,796,669 to Kiritani et al) ureaformaldehyde wall-formers and more particularly Urearesorcinolformaldehyde wall forms (in which oleophilicity is enhanced by the addition of resorcinal) (see U.S. Pat. Nos. 4,001,140; 4,087,376 and 4,089,802 to Foris et al) melamineformaldehyde resin and hydroxypropyl cellulose (see commonly assigned U.S. Pat. No. 4,0925,455 to Shackle). Preferred methods are described in U.S. Pat. Nos. 4,772,530 and 4,772,541. A particularly preferred method for preparing microcapsules is described in U.S. application Ser. No. 073,036 filed July 14, 1987.

The imaging sheet or donor sheet used in the present invention can be prepared as described in U.S. Pat. No. 4,399,209 and more particularly, for full color imaging, as described in U.S. Pat. No. 4,772,541.

Developer resins useful in the present invention are described in recently allowed U.S. patent application Ser. No. 073,036 filed July 14, 1987 corresponding to European Publication No. 0260129. A preferred example of a developer material useful in the present invention is a phenolic resin. These resins may be the condensation product of phenols (including substituted phenols) and formaldehyde. Suitably the phenol formaldehyde molar ratio is usually about 1:1 and the degree of condensation ranges from about 2 to 50, but is generally about 4 to 10. The resins may be further modified to include amounts of salicylic acids or substituted salicylic acids in a manner known in the art. Examples of other thermoplastic phenolic resins useful in the present invention are described in U.S. Pat. Nos. 3,455,721; 3,466,184; 3,672,935; 4,025,490; 4,226,962; and 4,647,952.

The phenolic developers are preferably metallated to improve their developing characteristics. This also contributes to their thermoplastic character as a type of ionomer is formed which dissociates into lower molecular weight species above a certain temperature, which largely depends upon the metal used, and associates into a 3-dimensional crosslinked material upon cooling. The resins may be metallated by reaction with a salt selected from the group consisting of copper, zinc, aluminum, tin, cobalt and nickel. Most typically, the resins are zincated to improve development. The metal content of the resins generally is about 1 to 5% by weight but may range up to 15%.

Representative examples of these phenolic resins are as follows: p-phenylphenol-formaldehyde polymer, p-fluorophenol-formaldehyde polymer, p-chlorophenolformaldehyde polymer, p-bromophenol-formaldehyde polymer, p-iodophenol-formaldehyde polymer, p-nitrophenol-formaldehyde polymer, p-carboxyphenol-formaldehyde polymer, p-carboalkoxyphenol-formaldehyde polymer, p-aroylphenolformaldehyde polymer, p-lower alkoxyphenol-formaldehyde polymer, p-alkyl($C_1$–$C_{12}$)-phenol-formaldehyde polymers, in which the p-alkyl($C_1$–$C_{12}$)-phenol is p-methylphenol, p-ethylphenol, p-n-propylphenol, p-isopropylphenol, p-tbutyephenol, p-n-amylphenol, p-isoamylphenol, p-cyclohexylphenol, p-1,1-dimethyl-n-propylphenol, p-n-hexylphenol, p-isohexylphenol, p-1,1-dimethyl-n-butylphenol, p-1,2-dimethyl-n-butylphenol, p-n-heptylphenol, p-isoheptylphenol, p-5,5-dimethyl-n-amylphenol, p-1,1-dimethyl-n-amylphenol, p-n-octylphenol, p-1,1,3,3-tetramethylbutylphenol, p-isooctylphenol, p-n-nonylphenol, p-isononylphenol, p-1,1,3,3-tetramethylamylphenol, p-n-decylphenol, p-isodecylphenol, p-n-undecylphenol, p-isoundecylphenol, p-n-dodecylphenol, etc., and polymers of formaldehyde and isomers of these p-alkyl-phenols where the alkyl groups have 1 to 12 carbon atoms, and copolymers of formaldehyde and mixtures containing two or more of these alkylphenols and the isomers thereof.

More particularly, alkylphenolic resins and, still more particularly, metallated products of alkylphenolic resins are used. The alkyl phenols are monosubstituted by an alkyl group which may contain 1 to 12 carbon atoms. Examples of alkylphenols are ortho- or para- substituted ethylphenol, propylphenol, butylphenol, amylphenol, hexylphenol, heptylphenol, octylphenol, nonylphenol, t-butylphenol, t-octylphenol, etc.

A preferred class of thermoplastic transferrable developer material is a resin-like condensation product of a polyvalent metal salt, such as a zinc salt, and a phenol, a phenol-formaldehyde condensation product, or a phenolsalicylic acid-formaldehyde condensation product. This type of developer material is available from Schenectady Chemical Co. under the designation HRJ 4250, HRJ 4252, and HRJ 4542. These products are reported to be a metallated condensation product of an ortho- or para-substituted alkylphenol, a substituted salicylic acid, and formaldehyde.

In addition to phenolic resins or as an alternative to phenolic resins, certain functionalized acrylic or vinylic resins are useful in the present invention. Examples of these resins are described in U.S. Pat. Nos. 4,853,364 and 4,877,767. These resins are preferably prepared by an emulsion polymerization process. The process is preferably controlled through monomer and catalyst addition to provide a particle having a core with a lower melt flow temperature and a lower minimum film forming temperature than the shell. For example, the core shell particle may have a nominal melt flow temperature of 80° to 130° C. and the core having a somewhat lower MFT.

Also useful in the present invention are blends of acrylic and phenolic developers as described in U.S. Pat. No. 4,853,364. The reader is directed to the examples of this patent which illustrate compositions which are also useful herein.

The foregoing resins may be used in the form of a film in which case they will be coated on the support for the developer from a solution of the resin which can be useful in printing by methods other than transferring images from microcapsules. However, with encapsulated imaging systems, developer resins are preferably used as a finely divided particle. In one case they can be coated from an aqueous emulsion, in other cases known wet and dry milling techniques may be used to prepare particles.

The developer sheet of the present invention is prepared by coating a support with a coating composition of the developer material using conventional coating methods. The developer material is usually applied to the surface of the support in an amount of about 8 to 15 g/m$^2$ depending upon the nature of the developer, particle shape and size, amount of binder present, and whether it is encapsulated or not.

Photoinitiators useful in the present invention are those typically employed in imaging systems. Exemplary photoinitiators are described in commonly assigned U.S. Pat. Nos. 4,751,102; 4,772,530; 4,772,541; 4,800,149; 4,842,980; 4,865,942; and 4,879,685.

Photocopy apparatuses useful in practicing the method of the present invention can be constructed by modifying known, commercially available, color copiers such as the Noritsu® Slide Printer, the Renaissa CC5500® from Brother Industries or the Cycolor® Copier from Seiko-Mead.

Having described the invention in detail and by reference to preferred embodiments thereof, it will be apparent that modifications and variations are possible without departing from the scope of the appended claims.

What is claimed is:

1. A method for forming laminated images comprising the steps of:

image-wise exposing an imaging sheet, said imaging sheet comprising a support having a layer of photosensitive microcapsules on the surface thereof, said microcapsules containing a photohardenable or photosoftenable composition and a color precursor;

assembling said image-wise exposed imaging sheet with a developer sheet, said developer sheet including a web having a layer of thermoplastic developer resin on the surface thereof, said resin being capable of reacting with said color precursor to form an image;

subjecting said assembly of said imaging sheet and said developer sheet to a uniform rupturing force to cause said photosensitive microcapsules to rupture and image-wise transfer said color precursor to said developer layer, wherein said color precursor reacts with said developer resin thereby forming an image thereon;

separating said imaging sheet from said developer sheet;

assembling said image-bearing developer sheet with a non-reactive substrate to form a second assembly;

subjecting said second assembly to heat and a uniform force to laminate said image-bearing developer sheet to said non-reactive substrate.

2. The method of claim 1 wherein said thermoplastic developer resin is a phenolic resin.

3. The method of claim 2 wherein said phenolic resin is coated on said web as finely divided particles.

4. The method of claim 1 wherein said web is a transparent plastic film.

5. The method of claim 4 wherein said plastic film has a thickness of about 3 to 12 microns.

6. The method of claim 4 wherein said plastic film is polyethylene terephthalate.

7. The method of claim 1 wherein said microcapsules contain a photohardenable composition.

8. The method of claim 2 wherein said phenolic resin is a metallated phenolic resin.

9. The method of claim 8 wherein said phenolic resin is a zincated phenolic resin.

10. The method of claim 1 wherein said developer resin is an acrylic or vinylic resin.

11. The method of claim 1 wherein said developer resin is a blend of a phenolic resin and an acrylic or vinylic resin.

12. The method of claim 4 wherein said non-reactive substrate is selected from the group consisting of cast coated paper, magazine stock, and plastic film.

13. The method of claim 12 wherein said non-reactive substrate is cast coated paper.

14. The method of claim 12 wherein said non-reactive substrate is magazine stock.

15. The method of claim 12 wherein said non-reactive substrate is a transparent plastic film and said method is useful in forming transparencies.

16. The method of claim 1 wherein said layer of microcapsules contains three sets of microcapsules sensitive to red, green and blue light respectively and said sets of microcapsules contain cyan, magenta and yellow image-forming agents respectively.

17. The method of claim 16 wherein said laminated images are full color images.

18. A method for forming laminated images comprising the steps of:

image-wise exposing an imaging sheet to actinic radiation, said imaging sheet comprising a support having a layer of photosensitive microcapsules on the surface thereof, said microcapsules comprising a photohardenable or photosoftenable composition and a color precursor;

assembling said image-wise exposed imaging sheet with a non-reactive substrate;

subjecting said assembly of said imaging sheet and said non-reactive substrate to a uniform rupturing force causing said photosensitive microcapsules to rupture and transfer an image-wise pattern of said color precursor to said non-reactive substrate forming a latent image thereon;

separating said imaging sheet from said latent image-bearing, non-reactive substrate;

assembling said latent image-bearing, non-reactive substrate with a developer sheet, to form a second assembly, said developer sheet including a web having a layer of thermoplastic developer resin on the surface thereof, wherein said resin reacts with said color precursor to form an image thereon; and subjecting said second assembly to heat and a uniform force sufficient to laminate said developer sheet to said non-reactive substrate.

19. The method of claim 18 wherein said thermoplastic developer resin is a phenolic resin.

20. The method of claim 19 wherein said phenolic resin is coated on said web as finely divided particles.

21. The method of claim 18 wherein said web is a transparent plastic film.

22. The method of claim 21 wherein said plastic film has a thickness of about 3 to 12 microns.

23. The method of claim 21 wherein said plastic film is polyethylene terephthalate.

24. The method of claim 18 wherein said microcapsules contain a photohardenable composition.

25. The method of claim 19 wherein said phenolic resin is a metallated phenolic resin.

26. The method of claim 25 wherein said phenolic resin is a zincated phenolic resin.

27. The method of claim 18 wherein said developer resin is an acrylic or vinylic resin.

28. The method of claim 18 wherein said developer resin is a blend of a phenolic resin and an acrylic or vinylic resin.

29. The method of claim 21 wherein said non-reactive substrate is selected from the group consisting of paper, plastic film, cardboard, container board, and glass.

30. The method of claim 29 wherein said non-reactive substrate is paper.

31. The method of claim 30 wherein said non-reactive substrate is xerographic bond paper.

32. The method of claim 29 wherein said non-reactive substrate is a transparent plastic film and said method is useful in forming transparencies.

33. The method of claim 18 wherein said layer of microcapsules contains three sets of microcapsules sensitive to red, green and blue light respectively and said sets of microcapsules contain cyan, magenta and yellow image-forming agents respectively.

34. The method of claim 33 wherein said laminated images are full color images.

* * * * *